Oct. 5, 1965 J. L. HUTSON 3,210,641

POWER CONTROL CIRCUIT EMPLOYING SEMICONDUCTOR SWITCHING MEANS RESPONSIVE TO THE SATURATION OF A MAGNETIC AMPLIFIER

Original Filed Dec. 19, 1961

INVENTOR
Jearld L. Hutson

BY [signature]
ATTORNEY

United States Patent Office 3,210,641
Patented Oct. 5, 1965

3,210,641

POWER CONTROL CIRCUIT EMPLOYING SEMICONDUCTOR SWITCHING MEANS RESPONSIVE TO THE SATURATION OF A MAGNETIC AMPLIFIER

Jearld L. Hutson, Richardson, Tex., assignor to Hunt Electronics Company, Dallas Tex., a corporation of Texas Original application Dec. 19, 1961, Ser. No. 160,541. Divided and this application Feb. 25, 1965, Ser. No. 435,287
19 Claims. (Cl. 321—46)

Figure 1:
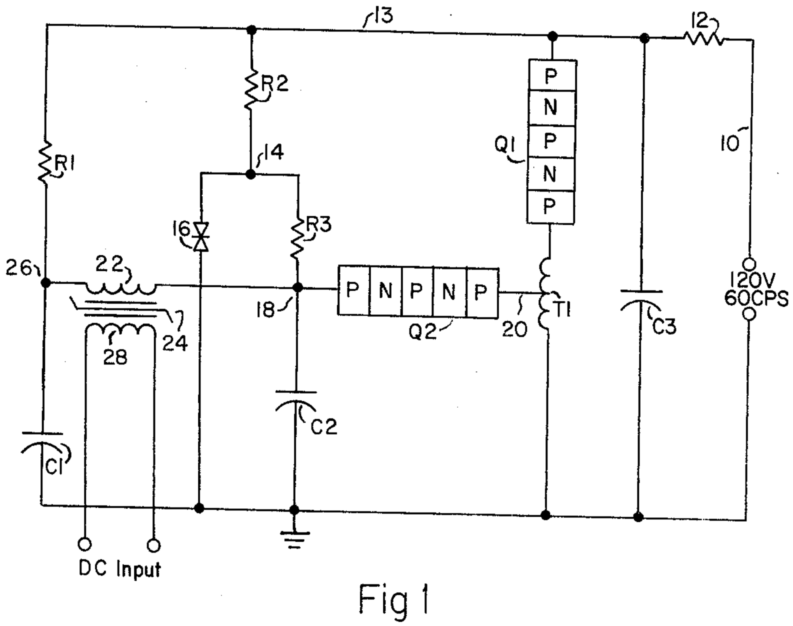

This is a division of application Serial No. 160,541 filed December 19, 1961. The present invention relates to apparatus for controlling the effective power applied to a load from a source of alternating current supply voltage by controlling the conduction time of a switching device connected in series with the load, and more particularly to such a power control circuit which utilizes a magnetic amplifier as a control element.

It is often times desirable to control the power applied to a load from an alternating current supply source as a function of a relatively low level signal. Feedback systems are exemplary of such applications. Also, in many instances it is desirable that the effective power applied to the load from the A.C. supply source be controlled as a function of several different variables.

Power control circuits which utilize magnetic amplifiers as a control element are especially well suited for the above applications since it is normal to flow D.C. current through the control windings of a magnetic amplifier and it is possible to have as many different control windings as desired. Moreover, by providing different control windings it is possible to achieve complete isolation between the various inputs.

The present invention provides an improved power control circuit for controlling the effective power applied to a load as a function of the current flowing in the control winding of a magnetic amplifier. In accordance with the principles of the present invention, there is provided a semiconductor switching means having first and second terminals and means for connecting the switching means by the first and second terminals in series with a load and a source of alternating current supply voltage. The switching means is characterized by being one which normally exhibits a high impedance between the two terminals in at least one direction but which is switched to a quasi stable state in which the switching means exhibits a low impedance in the at least one direction between the two terminals when a control signal is applied to the device. Once the switching means is switched to the quasi stable low impedance state, it will remain there so long as holding current flows through the two terminals. There is also provided a capacitor and a semiconductor diode switching means. The diode switching means is connected to the capacitor for providing a discharge path for the capacitor and applying to the first mentioned switching means a control signal responsive to the capacitor being charged to a voltage sufficient to cause the diode switching means to switch to a low impedance state. There is also provided a magnetic amplifier connected for applying to the capacitor energy to charge the capacitor to a voltage sufficient to cause the diode switching means to switch to the low impedance state responsive to saturation of the core of the magnetic amplifier. The control winding of the magnetic amplifier is adapted to be connected to a control voltage source. The amount of current flowing through the control winding controls the time relationship between the beginning of a half cycle of the alternating current supply voltage and the time at which the core of the magnetic amplifier becomes saturated, thereby controlling the conduction time of the switching means and the effective power applied to the load.

In accordance with the preferred embodiment of the invention, a second charge path for the capacitor is provided through resistive means connected to the alternating current supply voltage, and means is provided for limiting the voltage to which the capacitor can be charged from the second charge path during any half cycle to a voltage less than the breakover voltage of the diode switching means. Also, in accordance with the preferred embodiment of the invention, the gate winding of the magnetic amplifier is connected between the above mentioned capacitor and a second capacitor, with the second capacitor being charged through a resistive path from the alternating current supply voltage. The magnetic amplifier becomes saturated when the difference in the voltage to which the two capacitors are charged become sufficiently great. By utilizing the circuit of the preferred embodiment of the invention, it is practical to substantially reduce the demands placed upon the magnetic amplifier insofar as they relate to the amount of energy transferred through the gate winding and the amount of voltage that the magnetic amplifier must be able to withstand across its gate winding without becoming saturated.

Figure 2:
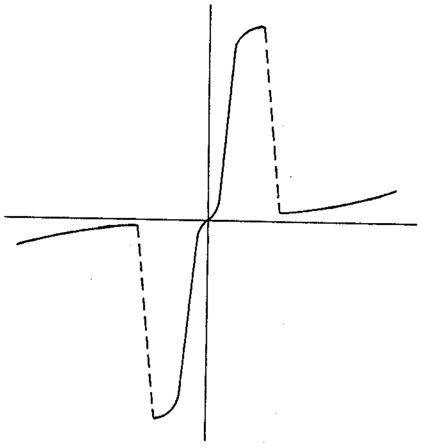

The features of the invention which are believed novel are set forth with greater particularity in the appended claims. Many objects and advantages of the invention will, however, become apparent to those skilled in the art as the following detailed description of a preferred embodiment of the same unfolds when taken in conjunction with the appended drawing in which:

FIGURE 1 is a schematic diagram illustrating a preferred embodiment of the present invention; and FIGURE 2 is a cure illustrating the voltage-current characteristics of a preferred type of device utilized in practicing the present invention.

Turning now to FIGURE 1 of the drawing, in accordance with the preferred embodiment of the present invention, one side of a source of alternating current supply voltage, suitably 120 volts, 60 cycles, is connected through line 10 to one side of a load 12. The other side of the load 12 is connected through device $Q_1$ and the output terminals of an auto transformer $T_1$ to the other side of the supply voltage source, which is suitably grounded.

The device $Q_1$ is suitably a symmetrical diode switching device whose voltage current characteristics are as shown in FIGURE 2. Thus, the device $Q_1$ will normally exhibit a high impedance to the flow of current in either direction. However, when the voltage impressed across the device becomes greater than the avalanche voltage of the device, the device will switch to a quasistable, low impedance state and permit the flow of current in one of the two directions, the direction of current flow being dependent upon the polarity of the applied voltage. The device will thereafter remain in the low impedance state until the current flowing through the device falls below the holding current for the device. Although a single device which exhibits a symmetrical switching action, that is a device which can be switched to permit the flow of current in either direction, is preferred, two oppositely poled asymmetrical switching devices connected in parallel can obviously be utilized. Also, the principles of the present invention can advantageously be utilized for controlling the conduction time of gated type switching devices such as the silicon controlled rectifier.

The other side of the load 12 is also connected through line 13 to one side of each of resistors $R_1$ and $R_2$. The under terminal of resistor $R_1$ is connected through capacitor $C_1$ to ground. Load 12 and resistor $R_1$ therefore provide a charging path for the capacitor $C_1$, with the charge on the capacitor $C_1$ being a function of the polarity of the half cycle of alternating current supply voltage and the resistance of the charging path.

The under terminal of the resistor $R_2$ is connected through resistor $R_3$ and capacitor $C_2$ to ground. The juncture 14 between resistor $R_2$ and resistor $R_3$ is connected through a double anode zener diode 16 to ground. Resistor $R_2$ functions as a voltage dropping resistor to limit the amount of current flowing through the zener diode 16. It will be observed that the zener diode 16 limits the potential appearing at juncture point 14 to the zener voltage of the double anode zener diode 16. The capacitor $C_2$ will be charged toward the zener voltage of the device 16 through a charge path comprising the resistor $R_3$. The maximum voltage to which the capacitor $C_2$ will be charged as a result of the flow of energy through the charge path comprising resistor $R_3$ will be not greater than the zener voltage of the device 16.

The juncture point 18 between the resistor $R_3$ and capacitor $C_2$ is connected through diode device $Q_2$ and the input 20 of the transformer $T_1$ to ground. The device $Q_2$ is suitably a symmetrical type device having breakover characteristics as shown in FIGURE 2. However, two oppositely poled asymmetrical diode devices can be used.

When the charge on the capacitor $C_2$ becomes equal to the breakover voltage of the device $Q_2$, the device $Q_2$ will switch to its low impedance state, providing a low resistance discharge path for the capacitor through the input 20 of the transformer $T_1$. The discharge of the capacitor $C_2$ through the device $Q_2$ and input 20 will result in a voltage pulse being induced in the transformer $T_1$ of a character to cause the device $Q_1$ to switch to its low impedance state.

The breakover voltage of the device $Q_2$ is suitably greater than the zener voltage of the device 16. The capacitor $C_2$ will therefore not be charged through resistor $R_3$ to a voltage sufficiently great to cause the device $Q_2$ to switch to its low impedance state. However, by properly choosing the resistance of the resistor $R_3$, it will be possible to operate the system under conditions wherein the breakover voltage of device $Q_2$ is less than the zener voltage of the device 16.

Juncture point 18 between resistor $R_3$ and capacitor $C_2$ is also connected through the gate winding 22 of a magnetic amplifier 24 to the juncture point 26 between resistor $R_1$ and capacitor $C_1$. The control winding 28 of the magnetic amplifier 24 is suitably connected to a variable D.C. power supply (not shown). As is well known in the art, the inductive impedance of the gate winding 22 will be quite large when the core of the magnetic amplifier is unsaturated. However, when the potential between juncture point 18 and juncture point 26 becomes sufficiently high, the core of the magnetic amplifier will become saturated. The inductive impedance of the magnetic amplifier 24 will, upon saturation, become quite small and the impedance between juncture point 18 and juncture point 26 will drop to a very low value. Upon this occurrence, capacitor $C_1$ will discharge, tending to charge the capacitor $C_2$. Subsequent to a saturation of the saturable reactor 24, both the capacitor $C_1$ and the capacitor $C_2$ will also be charged through the charge path comprising the resistor $R_1$. When the charge on capacitor $C_2$ becomes equal to the breakover voltage of the device $Q_2$, device $Q_2$ will switch to its low impedance state, providing a discharge path for the capacitor $C_2$ through the input 20 of transformer $T_1$. The discharge of the capacitor $C_2$ will result in a voltage appearing at the output terminals of transformer $T_1$, the voltage being of a character to cause the device $Q_1$ to switch to its low impedance state. Capacitor $C_3$ is suitably connected in shunt with device $Q_1$ and the output terminals of transformer $T_1$ for providing the desirable filtering action and assisting in application of the control signal to device $Q_1$ as described in the copending application Serial No. 160,541.

It will be noted that utilizing the above described arrangement, the magnetic amplifier 24 must only withstand the difference in voltage between juncture points 18 and 26. Also, since the capacitor $C_2$ is at least partially charged to a potential established by the zener diode 16, in many instances the amount of charge which must be transferred from capacitor $C_1$ to capacitor $C_2$ to accomplish the firing of the device $Q_2$ can be quite small, reducing the demands placed on the magnetic amplifier 24 and resulting in faster response in the action of the circuit.

It is very desirable that the magnetic amplifier 24 becomes saturated each half cycle, otherwise erratic firing and erratic control will result due to the charge left in the capacitor $C_1$ and the capacitor $C_2$ which was not dissipated before going into the succeeding half cycle. The components $R_1$, $R_2$, $R_3$, $C_1$, $C_2$, $Q_2$ and device 16 are therefore preferably chosen such that the magnetic amplifier 24 will saturate near the end of the half cycle, for example, at a phase angle of approximately 170°, when the current flowing through the control winding 28 is adjusted for minimum power out.

As is shown in the art, the voltage which must be impressed across the gate winding 26 to produce saturation of the magnetic amplifier 24 is dependent upon the magnitude of the current flowing in the control winding 28. Thus, the greater the current flowing in the control winding, the lower the voltage across the gate winding must be to produce saturation. Accordingly, as the amount of direct current flowing in the control winding 28 is increased, the magnetic amplifier 24 will become saturated at an earlier point in the half cycle of applied alternating current supply voltage, resulting in an increase in the effective power applied to the load.

From the above, it will be seen that the present invention provides an improved power control system that comprises a semiconductor switching means having at least two terminals and means for connecting said switching means by said two terminals in series with a load and a source of alternating current supply voltage. The semiconductor switching means normally exhibits a high impedance between the two terminals, but which is switched to exhibit a low impedance between the terminals in at least one direction when a control signal is applied thereto, There is also provided a capacitor and a diode switching device. The diode switching device normally exhibits a high impedance to the flow of current but is switched to a low impedance state when the charge on the capacitor becomes equal to the breakover voltage of the diode switching device. One terminal of the diode switching device is connected to the capacitor, the other terminal of the diode switching device being connected to apply to the switching means a control signal to cause the switching means to switch to the low impedance state responsive to discharge of the capacitor through the diode switching device. There is also provided a saturable reactor having a gate winding connected to provide a charging path for the capacitor from a source of alternating current supply voltage. The time in the half cycle of alternating current supply voltage at which the saturable reactor saturates, permitting the capacitor to become charged to a voltage equal to the breakover voltage of the diode device, is a function of the direct current flowing in the gate winding of the saturable reactor.

In accordance with the preferred embodiment of the invention, in order that the demands on the saturable reactor may be reduced, there is also provided means for charging the first capacitor to a voltage less than the breakover voltage of the diode device and a second capacitor connected to be charged to a voltage greater than the breakover voltage of the device, with a saturable reactor being connected between the first and second capacitors.

Although the invention has been described only with regard to a particular preferred embodiment thereof, many changes and modificaions will become obvious to those skilled in the art. The foregoing description is therefore intended to be illustrative and not limiting of the invention defined in the appended claims.

What I claim is:

1. A power control circuit comprising:
(a) semiconductor switching means having first and second terminals, said switching means normally exhibiting a high impedance between said first and second terminals in at least one direction and being switched to a quasi stable state wherein said device exhibits a low impedance in said at least one direction between said first and second terminals responsive to a control signal being applied to said switching means and remaining in said quasi stable state so long as holding current flows through said first and second terminals;
(b) means for connecting said switching means by said first and second terminals in series with a load and a source of alternating current supply voltage;
(c) a capacitor;
(d) switching means connected to said capacitor for providing a discharge path for said capacitor responsive to said capacitor being charged to a voltage sufficient to cause said switching means connected thereto to switch to a low impedance state;
(e) means effective responsive to discharge of said capacitor through said last mentioned switching means for applying to said first mentioned switching means a control signal to cause said first mentioned switching means to switch the low impedance state;
(f) a magnetic amplifier connected to apply to said capacitor energy to charge said capacitor to said voltage sufficient to cause said last mentioned switching means to switch to the low impedance state responsive to saturation of said magnetic amplifier; and
(g) means for controlling the time relationship between the beginning of the half cycle of alternating current supply voltage and the time at which the magnetic amplifier saturates to thereby control the conduction time of said switching means and the effective power applied to said load.

2. A power control circuit comprising:
(a) semiconductor switching means having first and second terminals, said switching means normally exhibiting a high impedance between said first and second terminals in at least one direction and being switched to a quasi stable state wherein said device exhibits a low impedance in said at least one direction between said first and second terminals responsive to a control signal being applied to said switching means and remaining in said quasi stable state so long as holding current flows through said first and second terminals;
(b) means for connecting said switching means by said first and second terminals in series with a load and a source of alternating current supply voltage;
(c) a capacitor;
(d) switching means connected to said capacitor for providing a discharge path for said capacitor responsive to said capacitor being charged to a voltage sufficient to cause said switching means connected thereto to switch to a low impedance state;
(e) means effective responsive to discharge of said capacitor through said last mentioned switching means for applying to said first mentioned switching means a control signal to cause said first mentioned switching means to switch to the low impedance state;
(f) a magnetic amplifier having a gate winding connected to apply to said capacitor energy to charge said capacitor to said voltage sufficient to cause said last mentioned switching means to switch to the low impedance state responsive to saturation of said magnetic amplifier; and
(g) means for connecting a control winding of said magnetic amplifier to a power supply whereby the time relationship between the beginning of a half cycle of alternating current supply voltage and the time at which said magnetic amplifier saturates is controlled as a function of the current flowing through said control winding from said power supply to thereby control the conduction time of said first diode switching device and the effective power applied to said load.

3. A power control circuit comprising:
(a) a semiconductor switching device having first and second terminals, said device normally exhibiting a high impedance between said first and second terminals in at least one direction and being switched to a quasi stable state in which said device exhibits a low impedance in said at least one direction between said first and second terminals responsive to a control signal being applied to said switching device and remaining in said quasi stable state so long as holding current flows through said first and second terminals;
(b) means for connecting said switching device by said first and second terminals in series with a load and a source of alternating current supply voltage;
(c) a capacitor;
(d) a diode switching device connected to said capacitor for providing a discharge path for said capacitor and applying to said first mentioned switching device said control signal responsive to said capacitor being charged to a voltage equal to the breakover voltage of said diode switching device;
(e) a magnetic amplifier connected for applying to said capacitor energy to charge said capacitor to the breakover voltage of said device responsive to saturation of said magnetic amplifier; and
(f) means for controlling the time relationship between the beginning of the half cycle of alternating current supply voltage and the time at which said magnetic amplifier saturates to thereby control the conduction time of said first mentioned switching means and the effective power applied to said load.

4. A power control circuit comprising:
(a) a semiconductor switching device having first and second terminals, said device normally exhibiting a high impedance between said first and second terminals in at least one direction and being switched to a quasi stable state wherein said device exhibits a low impedance in said at least one direction between said first and second terminals responsive to control signal being applied thereto and remaining in said quasi stable state so long as holding current flows through said first and second terminals;
(b) means for connecting said switching device by said first and second terminals in series with a load and a source of alternating current supply voltage;
(c) a capacitor;
(d) a diode switching device connected to said capacitor for providing a discharge path for said capacitor and applying to said first mentioned switching device said control signal responsive to said capacitor being charged to a voltage sufficient to cause said switching device to switch to a low impedance state;
(e) a magnetic amplifier having a gate winding and a control winding wound on a magnetic core;
(f) means connecting the gate winding of said magnetic amplifier to apply to said capacitor energy to charge said capacitor to a breakover voltage of said diode switching device responsive to saturation of said magnetic amplifier; and
(g) means for connecting the control winding of said magnetic amplifier to a power source whereby the time relationship between the beginning of a half cycle of alternating current supply voltage and the time at which said magnetic amplifier saturates is controlled as a function of the current flowing through the control winding of said magnetic amplifier from said power source.

5. A power control circuit comprising:

(a) first and second diode switching devices each having first and second terminals, said devices normally exhibiting a high impedance between said first and second terminals in at least one direction and being switched to a quasi stable state in which said devices exhibit a low impedance in said at least one direction between said first and second terminals responsive to the voltage across the devices becoming equal to the breakover voltage of the devices and remaining in said quasi stable state so long as holding current flows through said first and second terminals;

(b) means for connecting said first device by said first and second terminals in series with a load and a source of alternating current supply voltage;

(c) said first diode switching device being characterized by a breakover voltage greater than the maximum instantaneous voltage of the applied alternating current supply voltage and said second diode switching device being characterized by a breakover voltage substantially less than the maximum instantaneous voltage of said alternating current supply voltage;

(d) a capacitor;

(e) means connecting said second diode switching device to provide a discharge path for said capacitor responsive to said capacitor being charged to a voltage equal to the breakover voltage of said second diode switching device;

(f) means effective responsive to discharge of said capacitor through said second diode switching device for applying to said first diode switching device a voltage at least equal to the breakover voltage of said first diode switching device;

(g) a magnetic amplifier connected for applying to said capacitor energy to charge said capacitor to the breakover voltage of said second diode switching device responsive to saturation of said magnetic amplifier; and (h) means for controlling the time relationship between the beginning of a half cycle of supply voltage and the time at which said magnetic amplifier saturates to thereby control the conduction time of said switching means and the effective power applied to said load.

6. A power control circuit comprising:

(a) first and second diode switching devices each having first and second terminals, said devices normally exhibiting a high impedance between said first and second terminals in at least one direction and being switched to a quasi stable state in which said devices exhibit a low impedance in said at least one direction between said first and second terminals responsive to the voltage across the devices becoming equal to the breakover voltage of the devices and remaining in said quasi stable state so long as holding current flows through said first and second terminals;

(b) means for connecting said first device by said first and second terminals in series with a load and a source of alternating current supply voltage;

(c) said first diode switching device being characterized by a breakover voltage greater than the maximum instantaneous voltage of the applied alternating current supply voltage and said second diode switching device being characterized by a breakover voltage substantially less than the maximum instantaneous voltage of said alternating current supply voltage;

(d) a capacitor;

(e) means connecting said second diode switching device to provide a discharge path for said capacitor responsive to said capacitor being charged to a voltage equal to the breakover voltage of said second diode switching device;

(f) means effective responsive to discharge of said capacitor through said second diode switching device for applying to said first diode switching device a voltage at least equal to the breakover voltage of said first diode switching device;

(g) a magnetic amplifier connected for applying to said capacitor energy to charge said capacitor to the breakover voltage of said second diode switching device responsive to saturation of said magnetic amplifier; and (h) means for connecting a control winding of said magnetic amplifier to a power supply whereby the time relationship between the beginning of a half cycle of alternating current supply voltage and the time at which said magnetic amplifier saturates is controlled as a function of the current flowing through said control winding from said power supply to thereby control the conduction time of said first diode switching device and the effective power applied to said load.

7. A power control circuit as defined in claim 6 further including means effective for charging said capacitor to a voltage less than the breakover voltage of said second diode device.

8. A power control circuit as defined in claim 6 further including a second capacitor, means including a first resistor connected to provide a charge path from said supply voltage for charging said second capacitor to a voltage in excess of the breakover voltage of said second diode device, means including a second resistor connected to provide a charge path from said supply voltage for charging the first mentioned capacitor to a voltage less than the breakover voltage of said second diode device, and means connecting a gate winding of said magnetic amplifier between said first mentioned capacitor and said second capacitor.

9. A power control circuit as defined in claim 8 further including a zener diode having a zener voltage less than the breakover voltage of said second diode device connected in shunt with said second resistor and said first mentioned capacitor.

10. A power control circuit as defined in claim 9 further including a transformer having an input and an output, means connecting the input of said transformer in a series loop with first mentioned capacitor and the second diode device, and means connecting the output of said transformer to apply to the first diode device a voltage in excess of the breakover voltage of the first diode device responsive to the discharge of the first mentioned capacitor through the input of the transformer upon said second diode device switching to the low impedance state.

11. A power control circuit as defined in claim 10 wherein the output of said transformer is connected in series with the first diode device.

12. A power control circuit as defined in claim 11 wherein said first and second diode devices are symmetrical in their switching action.

13. A power control circuit as defined in claim 4 further including means effective for charging said capacitor to a voltage less than the breakover voltage of said diode switching device.

14. A power control circuit as defined in claim 4 further including a second capacitor, means including a first resistor connected to provide a charge path from said supply voltage for charging said second capacitor to a voltage in excess of the breakover voltage of said diode switching device, means including a second resistor connected to provide a charge path from said supply voltage for charging the first mentioned capacitor to a voltage less than the breakover voltage of said diode switching device, and means connecting a gate winding of said magnetic amplifier between said first mentioned capacitor and said second capacitor.

15. A power control circuit as defined in claim 14 further including a zener diode having a zener voltage less than the breakover voltage of said diode switching device connected in shunt with said first mentioned capacitor.

16. A power control circuit as defined in claim 15 further including a transformer having an input and output, means connecting the input of said transformer in a series loop with the first metioned capacitor and the diode switching device, and means connecting the output of said transformer to apply to the semiconductor switching device a voltage in excess of the breakover voltage of the semiconductor switching device responsive to the discharge of the first mentioned capacitor through the input of the transformer upon said diode switching device switching to the low impedance state.

17. A power control circuit as defined in claim 16 wherein the semiconductor switching device is a second diode switching device and wherein the output of said transformer is connected in series with the second diode switching device.

18. A power control circuit as defined in claim 4 wherein said semiconductor switching device and said diode switching device are symmetrical in their switching action.

19. A power control as defined in claim 17 wherein the breakover voltage of the first mentioned diode device is less than the maximum instantaneous voltage of said supply voltage and the breakover voltage of said second diode device is greater than the maximum instantaneous voltage of said supply voltage.

References Cited by the Examiner

UNITED STATES PATENTS

| | | | |
|---|---|---|---|
| 2,910,641 | 10/59 | Boyer | 321—66 |
| 2,998,547 | 8/61 | Berman | 315—200 |
| 3,005,946 | 10/61 | Thompson | 323—22 |
| 3,034,015 | 5/62 | Schultz | 315—97 |
| 3,160,806 | 12/64 | McDaniel et al. | 321—47 |
| 3,188,490 | 6/65 | Hoff et al. | 307—88.5 |
| 3,189,747 | 6/65 | Hoff | 307—32 |

FOREIGN PATENTS

| | | |
|---|---|---|
| 665,946 | 7/63 | Canada. |

LLOYD McCOLLUM, *Primary Examiner.*